July 31, 1962

E. D. METZ

PACKAGING TECHNIQUE FOR FABRICATION OF VERY SMALL SEMICONDUCTOR DEVICES

Filed July 21, 1958

3,047,780

INVENTOR.

E. David Metz.

BY Sprinkle and Horne

Att'ys.

3,047,780

PACKAGING TECHNIQUE FOR FABRICATION OF VERY SMALL SEMICONDUCTOR DEVICES

E. David Metz, Los Angeles, Calif., assignor to Pacific Semiconductors, Inc., Culver City, Calif., a corporation of Delaware Filed July 21, 1958, Ser. No. 750,008
6 Claims. (Cl. 317—234)

This invention relates to semiconductor devices and more particularly to improved microminiature devices.

It has long been recognized in the semiconductor art that a hermetically sealed package, wherein the semiconductor crystal is mounted within a miniaturized housing, the central region of which is composed of glass, affords a foundation for designing the ideal package.

In the semiconductor art, a region of semiconductor material containing an excess of donor impurities and yielding an excess of free electrons is considered to be an impurity-doped N-type region. An impurity doped P-type region is one containing an excess of acceptor impurities resulting in a deficit of electrons, or an excess of holes. Stated differently, an N-type region is one characterized by electron conductivity, whereas a P-type region is one characterized by hole conductivity. When a continuous, solid crystal specimen of semiconductor material has an N-type region adjacent a P-type region the boundary between the two regions is termed a P-N or an N-P junction, or simply a junction. Such a specimen of semiconductor material is termed a junction semiconductor device and may be used as a rectifier. A solid crystal specimen having two such junctions is termed a transistor. In addition to the junction type semiconductor devices, the point contact type and diffused junction type semiconductor devices are also now well known to the art.

The term semiconductor material as utilized herein is considered generic to germanium, silicon and germanium-silicon alloys, and is employed to distinguish these semiconductors from metallic oxide semiconductors such as copper oxide and selenium.

As the art of miniaturization has recently developed in the electronics industry it has been found necessary to reduce still further in size glass-to-metal packages housing the semiconductor devices. Inasmuch as the active crystal element of a semiconductor diode, for example, amounts to but a very small fraction of the total volume of the completed package, it is clear that as the volume of the package approaches that of the crystal the more nearly will optimum miniaturization be achieved. None of the prior art semiconductor devices presently available even approach this desired goal.

The prior art devices are typically housed in packages which involve a glass-to-metal seal requiring close manufacturing tolerances. Whisker contact must generally be made to one surface of the crystal which imposes a further manufacturing problem due to the tolerances which must be maintained. Due to the above limitations, the present art semiconductor crystal devices are expensive of manufacture and sometimes are not as reliable as is desired.

The present invention overcomes all of the above difficulties attendant in the manufacture of small semiconductor devices.

According to the basic concept of the presently preferred embodiment of this invention there is produced in accordance with well known prior art techniques such as fusion or diffusion a P-N junction semiconductor crystal. Metal tabs whose thermal coefficient of expansion is close to that of the semiconductor crystal material are ohmically bonded to opposite sides of the crystal, thus providing a low resistance contact to the P and N regions of the crystal. The perimeters of the tabs are made to approximate those of the crystal. Thereafter a passivating film or coating is bonded to the exposed surfaces of the crystal to eventually seal the same from the ambient, the film also making a hermetic seal with the tabs. If desired, wire leads may be butt welded or otherwise joined to the metal tabs. Thus, the size of the completed device, in accordance with the present invention, is not very much larger than that of the active crystal itself.

Accordingly, it is an object of the present invention to provide an improved semiconductor hermetically sealed device.

Another object of this invention is to provide a semiconductor device, the total size of which approaches that of the active crystal element.

Still another object of this invention is to provide a very small semiconductor device whose mechanical stability is greater than has heretofore been achievable.

Yet another object of this invention is to provide a very small semiconductor device of increased reliability.

A further object of the present invention is to provide a very small semiconductor device which lends itself to ease of manufacture thereby making it cheaper to produce.

A still further object of this invention is to provide a very small semiconductor device which requires fewer and less critical operations in manufacture.

While the novel and distinctive features of the invention are particularly pointed out in the appended claims, a more expository treatment of the invention, in principle and in detail, together with additional objects and advantages thereof, is afforded by the following description and accompanying drawing in which like reference characters are used to refer to like parts throughout the various views.

Figure 1:
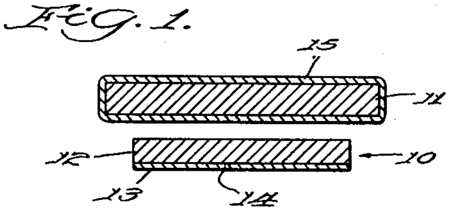
FIGURE 1 is a cross-sectional view showing a diffused junction semiconductor crystal diode and a plated metal tab during an early step in the production of a device in accordance with the present invention.

Referring now to the drawings, and more particularly to FIGURE 1 there is shown a cross-sectionl view of a semiconductor crystal body 10 and a metal tab 11 which is to be bonded to the crystal body 10 to provide a low resistance ohmic contact thereto. For purposes of example, it will be assumed that the semiconductor body 10 is of silicon and includes a P-type conductivity region 12 and an N-type conductivity region 13 separated by a P-N junction 14. The P-N junction may be produced by any method known to the art, such as diffusion, for example. It should be pointed out, that while this invention will generally be described with reference to P-N junction devices, it is equally applicable to semiconductor electrical translating devices which do not necessarily include a P-N junction but which nevertheless provide rectification at a barrier such as by the disposition of a film on the surface of a semiconductor body. Such a film may permit the device to exhibit diode action or even exhibit the characteristics of a voltage sensitive variable capacitor.

In the illustrative example under consideration the metal tab 11 should preferably be of a metal whose thermal coefficient of expansion is close to that of the semiconductor material. Such metals as Kovar and molybdenum have been found by the inventors to be particularly satisfactory.

In order to better form a low resistance contact between the crystal 10 and the metal tab 11 a coating of gold 15 is predeposited about the outer surface of the tab 11. It has been found advantageous to slightly dope the gold with a conductivity-determining active impurity of the same type as that of the semiconductor crystal region with which the metal tab is to make contact. Thus, with P-type conductivity it would be desirable to use a P-type conductivity impurity as the dopant in the gold layers 15; such a dopant might be aluminum, for example.

Figure 2:
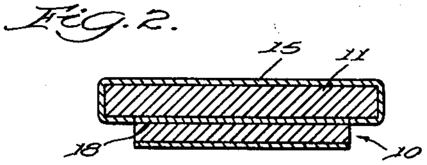
FIGURE 2 is a cross-sectional view of the metal tab and crystal of FIGURE 1 showing how they would appear after being joined together.

Referring now to FIGURE 2, the metal tab 11 is shown to be bonded to the crystal 10 to form a subassembly. The bond between the crystal and the tab is accomplished by a method well known to the art, whereby the metal tab and the semiconductor crystal are placed in an oven, and heated to a temperature sufficient to cause alloying between the silicon and the gold to produce a silicon-gold eutectic or an alloy region 18 (if, for example, silicon is to be the semiconductor material used). Temperatures ranging from about 360° to 385° C. may be suitably employed.

Figure 3:
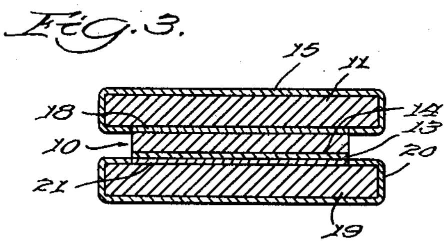
FIGURE 3 is a cross-sectional view showing a second metal tab joined to the subassembly of FIGURE 2.

Next, the subassembly of FIGURE 2 will have a second metal tab 19 coated with a layer of gold 20 bonded to the opposite face of the crystal 10 to produce a low resistance contact to N-type conductivity region 13 (see FIGURE 3). Again there will be produced a silicon-gold euctectic at 21, intermediate to the semiconductor crystal body 10 and the metal tab 19. It should be pointed out that it may also be desirable to dope the gold layer 20 with an N-type conductivity determining impurity, such as phosphorus, for example, for reasons hereinabove explained with reference to tab 11.

Figure 4:
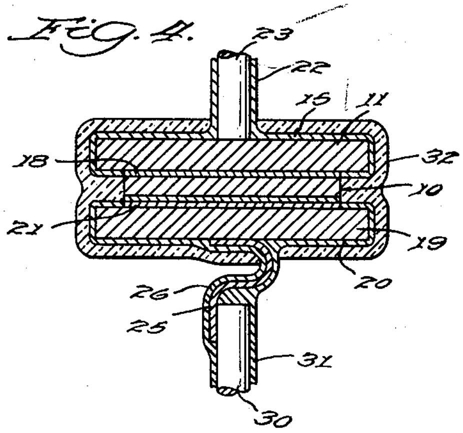
FIGURE 4 is a cross-sectional view of a completed semiconductor device in accordance with the presently preferred embodiment of this invention.

Referring now to FIGURE 4, there is shown a completed diode to which contacts have been provided. A first metal electrode 23 which may be made of copper, for example, is bonded to the metal tab 11 by means such as welding well known to the art. A gold coating 22 should be predeposited upon the electrode 23 to insure better bonding of the electrode to the tab. In order to provide some resilience to the completed package a thin metal ribbon 25 which should preferably have a gold coating 26 deposited thereupon is employed as the second electrode, it being bonded to the second metal tab 19 as shown. A second heavier electrode 30 may then be welded to the ribbon 25 to lend greater mechanical stability to the package. The electrode 30 should also preferably be coated with a layer of gold 31. After the two electrodes have been connected to the metal tabs as hereinabove described, a relatively thick polysiloxane film 32, i.e., greater than 1 micron in thickness will be deposited around and surrounding the crystal 10 and the tabs 11 and 19 as may be seen in FIGURE 4.

A thin passivation film underlying the polysiloxane film 32 is deposited in accordance with the methods described and claimed in co-pending U.S. patent application entitled "Improved Surface Treatment of Semiconductor Bodies" by Allan L. Harrington and Stanley Pessok, Serial No. 749,624, and U.S. patent application entitled "Improved Method and Means for Forming Passivation Films on Semiconductor Bodies" by Allan L. Harrington and Stanley Pessok, Serial No. 749,622, both filed concurrently herewith and assigned to the assignee of the present invention.

More particularly, a relatively thick polysiloxane film 32 is produced atop the thin film by a method hereinafter to be described which causes it to be molecularly bonded to the underlying silicon surface. The film can be built up to any thickness desired and for the purposes of this invention thicknesses ranging from 1 to 25 microns will normally be adequate.

In order to produce the relatively thick film a pre-esterified semiconductor surface, herein silicon, for purposes of example, is reacted with polyfunctional organo-silicon monomers to produce cross-linked or space polymers integrally bonded to the silicon surface. The major reactive ingredient in the polymerization reaction is a tri-functional organo-silicon compound having the general formula: $RSiX_3$ where R is a monovalent hydrocarbon radical (e.g., methyl, ethyl, phenyl, epoxy, vinyl, nitrile, etc.), and X is a reactive group capable of propagating a chain and cross-linking it to other chains. Among the many examples of suitable compounds are ethyl, triethoxy, silane, methyl, triethoxy silane, phenyl trihydroxy silane, and the like.

In addition to the tri-functional compound, various amounts of di-functional and/or mono-functional organo-silicon monomers are included to modify the mechanical and electrical properties of the resulting cross-linked polymer.

The underlying relatively thin film comprising an ester of the silicon material which is integrally and chemically bonded to the silicon surface may be formed by the method described and claimed in co-pending application, Serial No. 749,624, supra.

The subassembly of FIGURE 4 is immersed in an etch solution containing hydrofluoric acid as a principal element for a length of time sufficient to remove foreign matter, contaminants and work damage from the surface of the crystal body. The etch solution contains, for example, two parts by volume of hydrofluoric acid (about 40% concentration in water) and one part of nitric acid (about 90% concentration in water). The subassembly is then removed from the etch and immersed in a quench solution comprising primarily an organic liquid which has in its chemical structure a reactive hydroxyl group, broadly designated herein as ROH, specifically, a monohydric or polyhydric aliphatic alcohol containing from 1 to 4 carbon atoms per molecule. A 95% ethanol solution is particularly preferred. It is necessary to transfer the subassembly including the silicon body quickly from the etch solution to the quench solution to prevent undue exposure to the ambient. Briefly, hydrofluorsilicic acid ($H_2SiH_6$) formed at the silicon surface when the body is immersed in the quench solution will react with the ROH at the silicon surface to form ester groups which are molecularly bonded with the silicon as a film upon the silicon surface. The film is less than 1 micron and normally on the order of 100 to 1000 angstrom units in thickness. Quenching times ranging from about 5 seconds to 5 minutes may be suitably employed.

After formation of the relatively thin film comprising an ester of the underlying semiconductor material, i.e., silicon, the ester is reacted by reacting the ester groupings and the surface of the semiconductor material, in the thin film formed thereon, with a mixture comprising tri-functional silane monomers and mono- or di-functional monomers, or both, in predetermined proportion; together with reactive and inert catalysts as described in detail hereinafter. The body is immersed in the liquid monomeric mixture in this embodiment and the mixture is agitated to insure complete wetting of the surface. Other methods of wetting can, of course, be utilized as long as the wetting action is complete.

The esterified film is reacted with a mixture of organo-silane compounds, in which a trifunctional monomer predominates. The reactive group X of such monomers having the formular $RSiX_3$ can be any of a wide variety. The most reactive is the hydroxyl group but trihydroxy compounds have the disadvantage that they rapidly autopolymerize. Consequently it is preferred to use, as a starting material, a tri-alkoxy compound such as ethyl triethoxy silane and then hydrolyze the alkoxy compound to the hydroxy compound just prior to use. Such hydrolysis may be effected in a medium of water, amyl alcohol, toluene (which is a solvent for the hydrolysis products) and hydrogen chloride, which acts as a catalyst.

The reactive groups may also be groups such as mercapto, amino, or halide groups. These groups are not quite so effective as the preferred alkoxy or hydroxy substituted silanes. Chloride groups, for example, form only relatively thin pasivating films, whereas alkoxy and hydroxy compounds can be used to build up polymers of any desired thickness.

The addition of difunctional organo-silanes ($R_2SiX_2$) where R and X have the same definition as previously, increases the plasticity of the resulting cross-linked polymer. Diphenyl dihydroxy silane is particularly useful in this respect. Where the tri- and di-functional monomers are used alone, the ratio of tri- to di-functional compounds in the reaction mixture will be about 10 to 50% di-functional compound, and the balance tri-functional.

The addition of mono-functional organo-silanes ($R_3SiX$) serves to provide chain-terminating groups on the cross-linked polymer. When used in combination with the tri-functional compound alone, the mono-functional compound may be present in amounts of 1 to 10% by weight.

The mono-functional compounds may be added per se, as in the case of triphenyl silanol, or they may be added in a form which yield mono-functional groups in the reaction medium. The addition of hexamethyl siloxane which dissoriates into trimethyl silanes is an example of the latter.

When all three types of silane monomers are employed, the preferred amounts of each in the reaction mixture will be as follows:

| | Percent by weight |
|---|---|
| Mono-functional | 1–5 |
| Di-functional | 5–45 |
| Tri-functional | Balance |

An illustrative quench solution comprises an alcohol solution which can be broadly designated as ROH in which R is a hydrocarbon radical, preferably containing one to four carbon atoms. Hydrofluorylicic acid ($H_2SiF_6$) forms at the silicon surface when the silicon is immersed in the quench solution and will react with the ROH at the silicon surface to form an esterified film which is molecularly bonded with the silicon as a film upon the surface thereof. This film is synthesized by condensation polymerization of the Si-O linkages 500 angstroms in thickness. Thereafter the film 32 is produced by the generation by copolymerization of a mixture of polyfunctional, organo-silicon monomers which interact and react with the silicon semiconductor surface and the thin film formed thereon by the above-described previous treatment to yield a space polymer which is integral with the previously treated and real surface of the semi-conductor body 10. The monomeric organo-silicon materials utilized in accordance with this invention are more fully described in the co-pending U.S. patent application Serial No. 749,620 entitled Method and Means for Forming Passivation Films on Semiconductor Bodies, filed July 21, 1958, and assigned to the assignee of the present invention, and now Patent No. 2,913,358. Generally, the previously treated semiconductor material forms a relatively thin (less than 1 micron in thickness) film comprising an ester of silicon which has been integrally and chemically bonded to the surface thereof, and it is upon this thin film that the thickened polysiloxane film 32 is deposited. Thus, the completed device as shown in FIGURE 4 is hermetically sealed from the ambient by means of film 32 and the resulting device is thoroughly miniaturized, its overall size being not substantially greater than that of the active crystal element itself.

Figure 5:
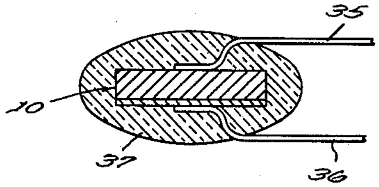
FIGURE 5 is a cross-sectional view of a first alternate embodiment of a semiconductor device in accordance with the present invention.

Referring now to FIGURE 5, there is shown the first alternative embodiment of a semiconductor device constructed in accordance with the present invention. In FIGURE 5, two fine wire conductor leads 35 and 36 are directly bonded to opposite faces of semiconductor crystal 10. A method by which wires 35 and 36 may be bonded is described in an article entitled Electrical Contact With Thermo-Compression Bonds by H. Christensen, at page 125 of the April 1958 issue of Bell Laboratories Record. After the leads 35 and 36 have been bonded to the semiconductor crystal 10, a polysiloxane coating 37 is deposited about the semiconductor crystal and part of the wires 35 and 36 to produce an integral unit as shown in FIGURE 5. The FIGURE 5 device therefore represents the ultimate in miniaturization. Therein, no additional elements other than the active crystal and the connecting leads are included; the polysiloxane film serving to protect and hermetically seal the complete unit from the ambient.

Figure 6:
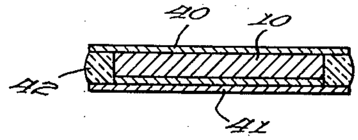
FIGURE 6 is a cross-sectional view of a second alternative embodiment of a semiconductor device in accordance with the present invention.

In FIGURE 6 a second alternative embodiment of a device similar to that in FIGURE 4 is shown. In the embodiment of FIGURE 6 the semiconductor crystal 10 is sandwiched between two thin copper tabs 40 and 41. It may be desirable to include a gold coating over the copper tabs 40 and 41 to insure a complete mechanical and electrical bond to the crystal, in much the same manner described with reference to the FIGURE 4 embodiment, but for purposes of simplicity such is not here shown. About the periphery of the crystal 10 which is not in contact with the tabs 40 and 41 there is disposed a polysiloxane film indicated at 42. In the FIGURE 6 embodiment as well as those previously designated it may be assumed that the semiconductor crystal is cylindrical in shape although this is not necessary. The film 42 is sealed to the opposite inner surface of the metal tabs 40 and 41 therein completing the hermetic sealing of the device. While copper has a thermal coefficient of expansion which is considerably greater than that of molybdenum or Kovar, it has been found that if the tabs 40 and 41 are made thin enough that the difference in the coefficient of expansion between that of the semiconductor materials and the other metal tabs will not cause any serious problems.

Figure 7:
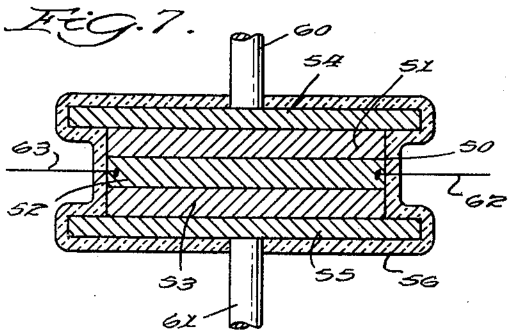
FIGURE 7 is a cross-sectional view of a third alternative embodiment of a semiconductor device in accordance with the present invention.

Referring now to FIGURE 7, a transistor 50 including a collector region 51, a base region 52, and an emitter region 53 is shown to be packaged between two intermediate tabs 54 and 55, with a polysiloxane film 56 surrounding both the tabs and the transistor 50. Direct contact to the tabs 54 and 55 may be made by means of leads 60 and 61 while contact to the base region 52 of the transistor is shown to be made by two separate thin wire leads 62 and 63 which may be bonded to the base region 52 in a manner similar to that described with reference to wires or leads 35 and 36 shown in FIGURE 5 embodiment.

Figure 8:
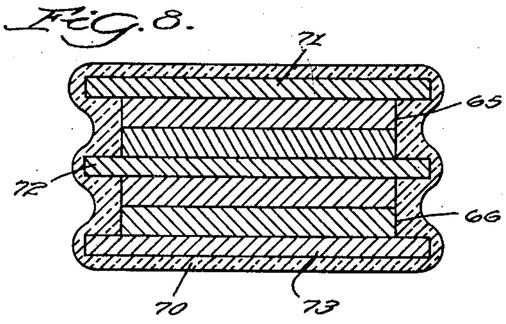
FIGURE 8 is a cross-sectional view of a fourth alternative embodiment of a semiconductor device in accordance with the present invention.

In FIGURE 9 still another embodiment in accordance with the present invention is shown. Two stacked diodes 65 and 66 are shown to be advantageously arranged within a package similar to that shown in FIGURE 8. The polysiloxane film 70 will, of course, surround the three metal tabs 71, 72, and 73 as well as the outer peripheries of the two diodes 65 and 66.

While the principles of the invention have been set forth hereinabove there will be obvious to those skilled in the art many modifications in structure, arrangement, proportions, the elements and components of the invention and otherwise which are particularly adapted for specific environments and operating requirements without departing from those principles.

The appended claims are therefore intended to cover and embrace any such modifications within the limits only of the true spirit and scope of the invention.

What is claimed as new is:

1. A semiconductor crystal wafer having substantially parallel planar upper and lower surfaces; a first metal tab in low resistance contact to the entirety of said upper planar surface; a second metal tab in low resistance contact with the entirety of said lower planar surface; a first elongate electrical lead having a portion thereof ohmically bonded to said first metal tab; a second elongate electrical lead having a portion thereof ohmically bonded to said second metal tab; and a polysiloxane film completely surrounding said crystal wafer, said metal tabs, and the portions of said electrical leads bonded to said metal tabs to hermetically seal said crystal wafer from the ambient.

2. A semiconductor crystal wafer having substantially parallel planar upper and lower surfaces of opposite conductivity types; a first metal tab in low resistance contact to the entirety of said upper planar surface; a second metal tab in low resistance contact with the entirety of said lower planar surface; a first elongate electrical lead having a portion thereof ohmically bonded to said first metal tab; a second elongate electrical lead having a portion thereof ohmically bonded to said second metal tab; and a polysiloxane film completely surrounding said crystal wafer, said metal tabs, and the portions of said electrical leads bonded to said metal tabs to hermetically seal said crystal wafer from the ambient.

3. A semiconductor transistor comprising, in combination: a semiconductor crystal wafer including upper and lower regions of one conductivity type separated by an intermediate region of the opposite conductivity type, said upper region defining a first planar contacting surface, said lower region defining a second planar contacting surface; a first metal tab in low resistance contact with the entirety of said first contacting surface; a second metal tab in low resistance contact with the entirety of said second contacting surface; a first elongate electrical lead having a portion thereof ohmically bonded to said first metal tab; a second elongate electrical lead having a portion thereof ohmically bonded to said second metal tab; a third elongate electrical lead having a portion thereof bonded to said intermediate region of said crystal wafer; and a continuous encapsulating coating completely surrounding said crystal wafer, said metal tabs, and the bonded portions of said elongate electrical leads to hermetically seal said crystal wafer from the ambient.

4. A semiconductor transistor comprising, in combination: a semiconductor crystal wafer including upper and lower regions of one conductivity type separated by an intermediate region of the opposite conductivity type, said upper region defining a first planar contacting surface, said lower region defining a second planar contacting surface; a first metal tab in low resistance contact with the entirety of said first contacting surface; a second metal tab in low resistance contact with the entirety of said second contacting surface; a first elongate electrical lead having a portion thereof ohmically bonded to said first metal tab; a second elongate electrical lead having a portion thereof ohmically bonded to said second metal tab; a third elongate electrical lead having a portion thereof bonded to said intermediate region of said crystal wafer; and a polysiloxane film completely surrounding said crystal wafer, said metal tabs, and the bonded portions of said elongate electrical leads to hermetically seal said crystal wafer from the ambient.

5. A semiconductor electrical translating device as defined by claim 4 wherein said polysiloxane film has a thickness in excess of one micron, said film being molecularly bonded to said semiconductor wafer.

6. A transistor as defined in claim 4 wherein said polysiloxane film has a thickness in excess of one micron, said film being molecularly bonded to said crystal wafer.

References Cited in the file of this patent

UNITED STATES PATENTS

| | | |
|---|---|---|
| 2,293,248 | Fink et al. | Aug. 18, 1942 |
| 2,796,562 | Ellis et al. | June 18, 1957 |
| 2,798,189 | Alexander | July 2, 1957 |
| 2,809,332 | Sherwood | Oct. 8, 1957 |
| 2,827,401 | Laughline et al. | Mar. 18, 1958 |
| 2,827,597 | Lidow | Mar. 18, 1958 |
| 2,837,618 | Gildart | June 3, 1958 |
| 2,849,665 | Boyer et al. | Aug. 26, 1958 |
| 2,877,394 | Kuhrt | Mar. 10, 1959 |
| 2,906,931 | Armstrong | Sept. 29, 1959 |
| 2,912,354 | Jung | Nov. 10, 1959 |
| 2,913,358 | Harrington et al. | Nov. 17, 1959 |